(12) United States Patent
Wang et al.

(10) Patent No.: US 10,671,784 B2
(45) Date of Patent: Jun. 2, 2020

(54) TRANSIENT IR-DROP WAVEFORM MEASUREMENT SYSTEM AND METHOD FOR HIGH SPEED INTEGRATED CIRCUIT

(71) Applicant: BEIHANG UNIVERSITY, Beijing (CN)

(72) Inventors: Xiaoxiao Wang, Beijing (CN); Pengyuan Jiao, Beijing (CN); Donglin Su, Beijing (CN); Aixin Chen, Beijing (CN)

(73) Assignee: BEIHANG UNIVERSITY, Beijing (CN)

( * ) Notice: Subject to any disclaimer, the term of this patent is extended or adjusted under 35 U.S.C. 154(b) by 697 days.

(21) Appl. No.: 15/297,080

(22) Filed: Oct. 18, 2016

(65) Prior Publication Data

US 2017/0039309 A1 Feb. 9, 2017

(30) Foreign Application Priority Data

Nov. 11, 2015 (CN) .......................... 2015 1 0776327

(51) Int. Cl.
  *G06F 30/367* (2020.01)
  *G01R 19/165* (2006.01)
  *G06F 30/394* (2020.01)

(52) U.S. Cl.
  CPC ..... *G06F 30/367* (2020.01); *G01R 19/16552* (2013.01); *G06F 30/394* (2020.01)

(58) Field of Classification Search
  USPC ........................................................ 716/115
  See application file for complete search history.

(56) References Cited

U.S. PATENT DOCUMENTS

| | | | |
|---|---|---|---|
| 2008/0189516 A1* | 8/2008 | Singh .................... | G06F 1/3203 712/203 |
| 2013/0311792 A1* | 11/2013 | Ponnathota ............... | G06F 1/26 713/300 |

\* cited by examiner

*Primary Examiner* — Eric D Lee

(57) ABSTRACT

A transient IR-drop waveform measurement system and method for a high speed integrated circuit are provided. The system includes all-digital elements and is based on a ring oscillator in GHz. Through oscillation with a Fast Ring Oscillator, sampling with an Edge Detector and counting with a Ripple Counter, a width and a peak of an IR-drop waveform are obtained. Moreover, a power supply network is adapted during a clock cycle through sending an adaptation signal to a connected dynamic voltage frequency scaling (DVFS) system. The measurement method includes 11 steps. The measurement system has following features: 1) IR-drop peak/width measurement ability; 2) low fabrication and test cost; 3) high accuracy and sensitivity; 4) early adaptation ability. Therefore, the measurement system can be used alone for chip monitoring or testing, in order to reduce a power supply noise disturbance to a chip.

1 Claim, 11 Drawing Sheets
(3 of 11 Drawing Sheet(s) Filed in Color)

TRANSIENT IR-DROP WAVEFORM MEASUREMENT SYSTEM AND METHOD FOR HIGH SPEED INTEGRATED CIRCUIT

CROSS REFERENCE OF RELATED APPLICATION

The application claims priority under 35 U.S.C. 119(a-d) to CN 201510776327.2, filed Nov. 11, 2015.

BACKGROUND OF THE PRESENT INVENTION

Field of Invention

The present invention relates to a system for measuring the power supply noise, in and more particularly to a transient IR-drop waveform measurement system and method for a high speed integrated circuit. The present invention belongs to a field of micro electronic device technology.

Description of Related Arts

An integrated circuit (IC) is a kind of micro electronic device or component. After a series of semiconductor manufacturing processes, including oxidation, photolithography, proliferation, extension, and aluminum evaporation, the required components, such as the semiconductors, the resistors, and the capacitors, and the connecting wires among the components are integrated in a small piece of silicon wafer to constitute circuits having certain functions. Then the small piece of the silicon wafer is welded and packaged in a pipe shell of the electronic device. All the components in the structure have formed a unity so that the electronic components take a major step forward toward miniaturization, low-power, intelligence and high reliability.

With the silicon technology scaling, the gate length of the advanced complementary metal oxide semiconductor (CMOS) device is shorter than 40 nm, and the maximum frequency of operation has already reached GHz. As a result, the switching activity is getting more intense. Under the impact of the parasitic resistor and inductor, two severe noises, respectively IR-drop and $$L\frac{di}{dt},$$

are generated in the power supply network.

The Chinese patent application, CN 200910052451.9, filed Jun. 3, 2009, disclosed a fast supply network design method, and a schematic diagram of the power supply network is showed in FIG. 1.

For 40 nm and below technologies, it is common to observe a power supply noise with a peak that equals 10%-20% of the power supply voltage. With the decrease of the power supply voltage level by 10%-20%, the maximum operating frequency of voltage sensitive digital blocks reduces by nearly the same proportion, which reduces the operating speed of the gate circuit unit and affects the operation and performance of sensitive circuits. Especially in some chips, in order to achieve a faster operating speed, the chips adopt the P-channel metal oxide semiconductor (PMOS) and the N-channel metal oxide semiconductor (NMOS) with the lower threshold. For example, in some chips, the threshold voltage is as low as 10% to 15% of the reference voltage, which greatly increases the probability of error. The excessive IR-drop can even cause functional failures such as timing failure, abnormal reset and static random access memory (SRAM) flipping.

Therefore, the transient waveform of the IR-drop needs to be accurately monitored in field in order to prevent the function failure of the IC. However, due to the unknown process variations, a gap always exists between the simulated and actual waveform. In other words, it is difficult to accurately simulate the in-field IR-drop waveform by electronic design automation (EDA) tools during the design stage. As a result, silicon monitoring is of great need. The traditional methods for measuring the IR-drop include the off-chip measurement method and the on-chip measurement method. The off-chip method refers to measuring the IR-drop by high-end equipment such as the oscilloscope and the automatic test equipment (ATE), which does not need to modify the layout of the chip. However, the limitations of the off-chip equipment are relatively large, mainly including following problems.

(a) The off-chip equipment cannot monitor in-field.

(b) Due to the observation depth limitation, the off-chip equipment is impossible to extract the IR-drop from a location deep in the circuit and far from the VDD pins.

(c) Under the operating frequency of Giga Hertz, the off-chip measurement accuracy is easily affected by the parasitic parameters of the probe and the transmission cable.

With the decrease of the unit area silicon cost, in-field monitoring and adaptation are realized with the help of on-chip sensors. The on-chip sensors have the advantages of low parasitic parameters, high resolution, and in-field monitoring combined with other adaptation systems.

In the previous work, R. Petersen et al. proposed Voltage transient detection and induction for debug and test, illustrating that IR-drop monitoring is usually performed by the analog-to-digital converter (ADC). By connecting the power supply grid with the noise to the frontend of the ADC, the voltage level of the power supply noise is sampled and converted into a series of digital signatures. Later the transient waveform is recovered from the signatures by the digital-to-analog converter (DAC). Although the above mentioned method has a good effect, the area overhead and analog-digital integration effort are usually very high. Moreover, when the system frequency reaches GHz, the extra high ADC sampling frequency may cause significant design effort and power consumption. In 2014 IEEE Computer Society Annual Symposium, Y. Wang et al. proposed *A compact cmos ring oscillator with temperature and supply compensation for sensor application*, which loops back the inverted paths for measuring the IR drop by all digital components such as the ring oscillators (ROs). However, as the RO frequency only reflects the average IR-drop level from several to thousands of clock cycles, the IR-drop peak or duration information is lost. To better describe the IR-drop waveform, M. Fukazawa and M. Nagata published *Measurements of digital signal delay variation due to dynamic power supply noise*, and the delay-to-digital converters are adopted. However, as the signature is generated every clock cycle, the transient IR-drop peak/width within one clock cycle still cannot be fully rebuilt form the measurement results.

Although the above measurement methods apply the on-chip measurement system, but the measurement precision of the transient IR-drop waveform is low, the power consumption is large, and the measurement speed is slow.

SUMMARY OF THE PRESENT INVENTION

An object of the present invention is to provide a transient IR-drop waveform measurement system and method for a high speed integrated circuit. Width and peak information of an IR-drop waveform is able to be measured and reconstructed through the system. Moreover, combined with various types of dynamic voltage frequency scaling (DVFS) systems, an IR-drop of a region susceptible to a power supply noise is able to be adapted in time, which avoids functional failures such as timing failure, abnormal reset and static random access memory (SRAM) flipping caused by an excessive IR-drop.

The transient IR-drop waveform measurement system for the high speed integrated circuit is provided. Switching activities are frequent in L regions of an integrated circuit chip, and each region is connected to a power supply network, so a power supply noise is easy to appear.

A transient IR-drop waveform measurement system for a high speed integrated circuit comprises a Control Register, transient IR-drop waveform measurement modules, and a Decision Logic Module. L measurement modules are placed in L regions of an integrated circuit chip. The L measurement modules share the Control Register and the Decision Logic Module for a low area overhead.

For the Control Register, configuration values are written into the Control Register through serial or parallel data interfaces before measuring. The configuration values include a measurement start time, a measurement window length, a sampling window length, and an adaptation threshold.

On the one hand, the Decision Logic Module determines whether an adaptation mode is needed according to an output of a Differentiator. If the output is smaller than the adaptation threshold stored in the Control Register, the Decision Logic Module switches to logic "1" to compensate the power supply network. On the other hand, the Decision Logic Module is able to achieve a calibration for an Edge Detector in the measurement module.

The transient IR-drop waveform measurement module located in a first region A is denoted as a first transient IR-drop waveform measurement module 2A.

The transient IR-drop waveform measurement module located in a second region B is denoted as a second transient IR-drop waveform measurement module 2B.

The transient IR-drop waveform measurement module located in an $L^{th}$ region L is denoted as an $L^{th}$ transient IR-drop waveform measurement module 2L.

A structure of each measurement module in each region is identical, comprising a Fast Ring Oscillator (RO) 20D, the Edge Detector 20E, a Ripple Counter 20A, the Differentiator 20B and a Timer 20C.

The Edge Detector 20E detects an occurrence of IR-drop falling and rising edges by splitting a measurement window into multiple sampling windows through two to three buffers and provides an m-bit Edge_Indicator[m-1:0] in each sampling window to form a binary digit string. For the binary digit string Edge_Indicator[m-1:0], the logic "1" means an IR-drop exists in the sampling window, while logic "0" represents not.

The Fast RO 20D is for detecting an average IR-drop as an oscillation frequency of the Fast RO 20D is sensitive to a power supply voltage level. To reduce a frequency measurement error, the oscillation frequency of the Fast RO 20D is suggested to be as high as possible. An oscillation time of the Fast RO 20D is determined by the measurement window length configured through the Timer 20C.

The Ripple Counter 20A comprises n pairs of inverters and flip-flops. With a cooperation of the fast RO 20D, the Ripple Counter 20A counts an overall oscillation number of the Fast RO 20D at an end of the measurement window. The measurement window is divided into several adaptation grids. A counter value of the Ripper Counter 20A is transmitted to the Differentiator 20B at an end of each adaptation grid.

The Differentiator 20B, connected between the Ripple Counter 20A and the Decision Logic Module, is a second order difference module for comparing a value of an oscillation number within one adaptation grid and the adaptation threshold; the Differentiator 20B comprises three registers, a comparator and a subtractor; two consecutive counter values from the Ripple Counter 20A are input into the subtractor at the end of each adaptation grid, and a difference between the two consecutive counter values is input into the Decision Logic Module; if the difference is smaller than predefined adaptation threshold, the adaptation mode is triggered;

The Timer 20C is for generating clock signals required by the Differentiator, the Fast RO, and the Edge Detector through a system clock.

Another object of the present invention is to provide a transient IR-drop waveform measurement method for the high speed integrated circuit, comprising following steps, as shown in FIG. 9.

Step 1: Selecting Regions with a Large IR-Drop

The regions with the potentially high IR-drop (namely with a large number of gates switching simultaneously) are selected and marked by applying functional or structural test patterns through an electronic design automation (EDA) tool named IC Compiler.

Step 2: Integrating the System

The Control Register and the Decision Logic Module are placed in spare areas of the integrated circuit chip without too much congestion, while the multiple measurement modules (respectively 2A, 2B . . . 2L) are inserted into the marked regions. Then the measurement modules are connected to the power supply network corresponding to the respective region, and the system clock is routed to an input end of the Timer 20C automatically by the EDA tool.

Step 3: Determining the Measurement Window Length and the Sampling Window Length The measurement window length is determined according to the system clock. For a single-clock system with only positive-edge devices, the measurement window can be as long as one system clock cycle. For a region comprising both the positive-edge devices and negative-edge devices, double IR-drop peaks occur in each clock cycle, thus the measurement window should equal to half of the system clock cycle. For a multiple-clock region, the measurement window is suggested to be the same as the shortest clock cycle. Meanwhile, an optimal sampling window length is determined according to the number of the buffers in the Edge Detector 20E.

Step 4: Generating Lookup Tables

Besides an overall counter value within the measurement window and signatures of the Edge Detector 20E obtained directly from the measurement module, the IR-drop peak is required to obtain an IR-drop waveform, and thus a fast three-dimensional lookup table needs to be generated for showing a relationship among the IR-drop peak, an IR-drop width and a normalized counter value. Moreover, as process and temperature variations may affect an operation of the proposed measurement system, several lookup tables are generated for showing the relationship among the IR-drop peak, the IR-drop width and the normalized counter value under different temperatures.

The step 4 of generating the lookup tables further comprises steps of:

1) generating an $N_0$-K lookup table (shown in FIG. 4a) suitable for each manufactured Fast RO, wherein the $N_0$-K lookup table correlates a noise-free counter value $N_0$ and a temperature K ranging from −40° C.-120° C.; and depicting the $N_0$-K lookup table by an automatic test equipment (ATE) during a production test;

2) generating a K-

$$\left|\frac{\partial T}{\partial VDD}\right|$$

lookup table (shown in FIG. 4b) suitable for a specific Fast RO during the production test through inputting VDD and measuring a variation of a Fast RO oscillation period under the various temperatures K ranging from −40° C.-120° C., wherein the K-

$$\left|\frac{\partial T}{\partial VDD}\right|$$

lookup table correlates the temperature K and the $$\left|\frac{\partial T}{\partial VDD}\right|;$$

3) repeating above two steps for each on-chip Fast RO during the production test, and storing obtained lookup tables either on-chip or off-chip; and 4) obtaining a three-dimensional $V_p$-$t_w$-$N_{norm}$ lookup table (shown in FIG. 4c) through simulating by Simulation Program with Integrated Circuit Emphasis (SPICE), wherein: the three-dimensional $V_p$-$t_w$-$N_{norm}$ lookup table correlates a width $t_w$ of the IR-drop waveform, a peak $V_p$ of the IR-drop waveform, and the normalized counter value $N_{norm}$ at the various $$\left|\frac{\partial T}{\partial VDD}\right|;$$

and the various $$\left|\frac{\partial T}{\partial VDD}\right|$$

are easily obtained by changing a load or a cell type of an arbitrary Fast RO.

Step 5: Determining the Adaptation Threshold

To minimize an adaptation reaction time, the adaptation threshold is determined according to the output of the Differentiator 20B, which is obtained within one adaptation grid. During an ATE test, an intensity of the structural or functional patterns is increased until a first failure occurs, and the corresponding output is assigned as the adaptation threshold.

Step 6: Configuring the Control Register

Before measurement, the Control Register is configured. The step 6 of configuring the Control Register further comprises steps of: writing a start clock cycle, the measurement window length, a branch configuration of the Edge Detector 20E, the adaptation threshold, and a length of the Fast RO 20D into the Control Register.

Step 7: Calibrating the Edge Detector

Inside each branch of the Edge Detector, lengths of two sub-branches are calibrated to be close to each other. By increasing a length of a strong sub-branch, the Decision Logic Module checks the Edge_Indicator[m-1:0] all the time. If no too much IR-drop exists, every bit of the signature should be the logic "0". Once a specific bit flips during checking, a calibration for the corresponding branch ends.

Step 8: Measuring the Temperature

In the step 7, a three-step lookup table checking process is provided. Since different delay-VDD sensitivities correspond to different three-dimensional planes, a proper plane for obtaining a noise peak should be determined before in-field detecting. To obtain a local temperature, the Fast RO oscillates for a time length of the measurement window M with little circuit activities, and the counter value is recorded. Finally, according to the already generated lookup tables, an in-field temperature is obtained.

Step 9: Monitoring in-Field

During in-field monitoring, the system starts at a predefined time, and works for a time that equals to the measurement window length. The obtained counter values within the measurement window and each adaptation grid, and an m-bit signature value Edge_Indicator[m-1:0] of the Edge Detector 20E are stored in data registers or the SRAM.

Step 10: Adapting in-Field

The Decision Logic Module compares the output of the Differentiator with the predefined adaptation threshold. When an IR-drop noise is over the threshold, the output of the Decision Logic Module switches to the logic "1" to adapt the DVFS system and compensates the power supply network.

Step 11: Reconstructing the IR-Drop Waveform

After in-field measurement, such as during a customer return, the recorded $N_0$, the counter value N and values of the Edge_Indicator[m-1:0] are read out. Then, the width and the peak of the IR-drop are calculated according to the above read out values and the lookup tables. Finally, a triangular IR-drop is reconstructed.

The advantages of the proposed transient IR-drop waveform measurement system and method are described as follows.

Firstly, the system is able to accurately measure the peak and width information of the power supply noise and rebuild the transient waveform during one system clock cycle.

Secondly, an IR-drop noise peak and width detection resolution respectively reach 100 mV and 0.125 ns, with a noise peak and width measurement error rate less than 6.8% and 9.0%, for 97% of the Monte Carlo samples considering process variations.

Thirdly, the system is all-digital with a low overhead, and thus the system is easy to be integrated into a modern IC design flow.

Fourthly, the system does not influence a system on chip (SoC) function or a structural test. Both of the IR-drop measurement and adaptation are able to be performed during functional and test phases.

Fifth, the lookup tables and Edge Detector calibration are used during a design stage and a manufacturing test for the system, which are robust against process and in-field temperature variations.

Sixthly, the system realizes an early adaptation for the power supply network in several nanoseconds.

These and other objectives, features, and advantages of the present invention will become apparent from the following detailed description, the accompanying drawings, and the appended claims.

BRIEF DESCRIPTION OF THE DRAWINGS

The patent of application file contains at least one drawing executed in color. Copies of this patent or patent application publication with color drawing(s) will be provided by the Office upon request and payment of the necessary fee.

and the temperature according to the preferred embodiment of the present invention.

Figure 4A:
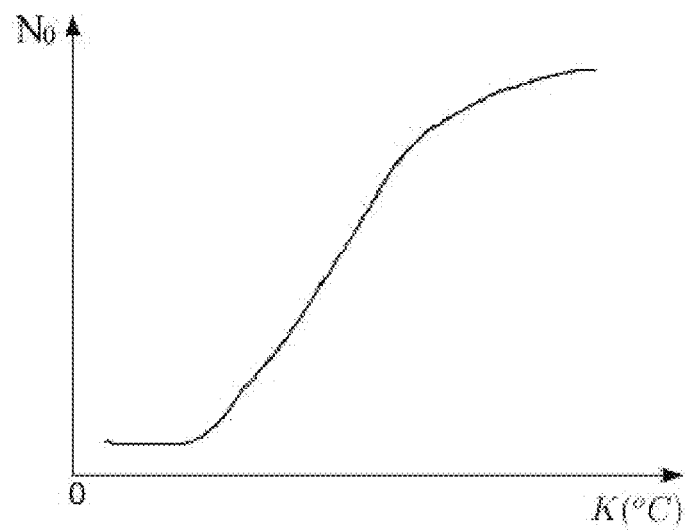
FIG. 4(a) is a sketch diagram of a relationship between a noise-free counter value and a temperature according to the preferred embodiment of the present invention.
Figure 4B:
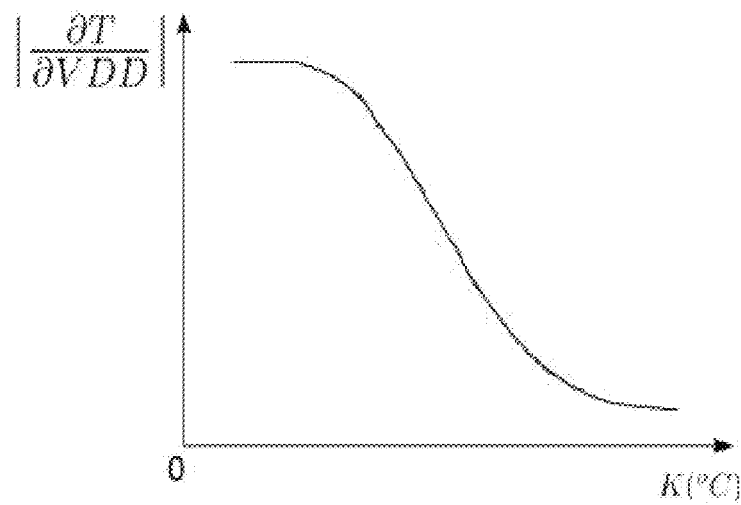
FIG. 4(b) is a sketch diagram of a relationship between a delay-VDD sensitivity $$\left|\frac{\partial T}{\partial VDD}\right|$$
Figure 4C:
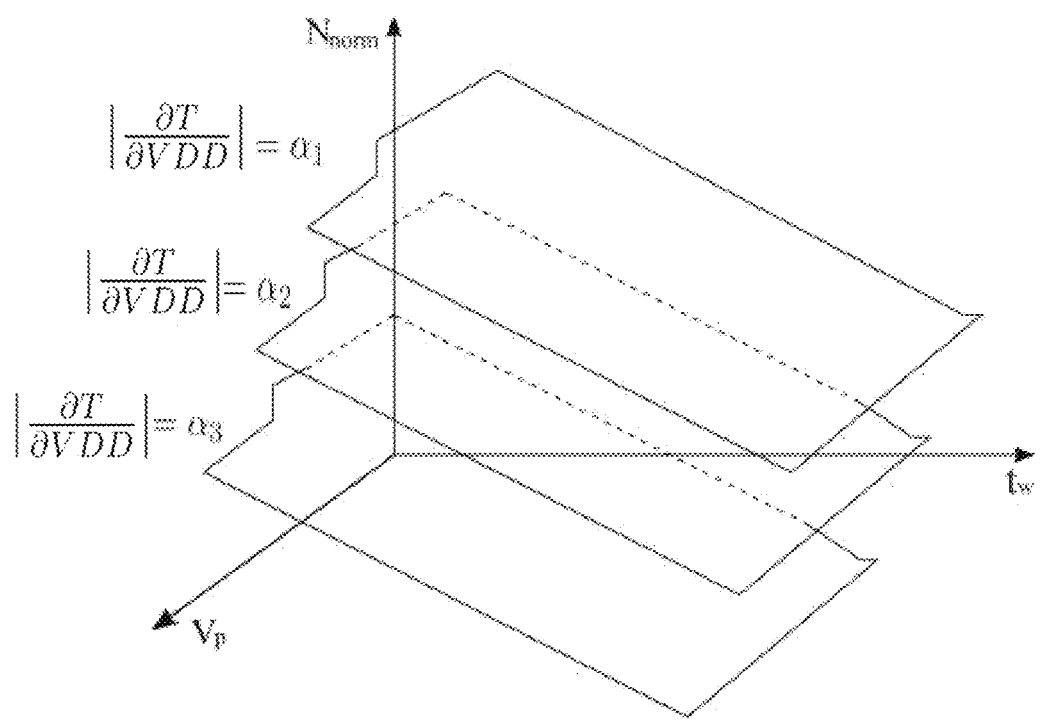

FIG. 4(c) is a three-dimensional sketch diagram of a relationship among an IR-drop width, an IR-drop peak, and a normalized counter value under the different $$\left|\frac{\partial T}{\partial VDD}\right|$$

according to the preferred embodiment of the present invention.

Figure 5A:
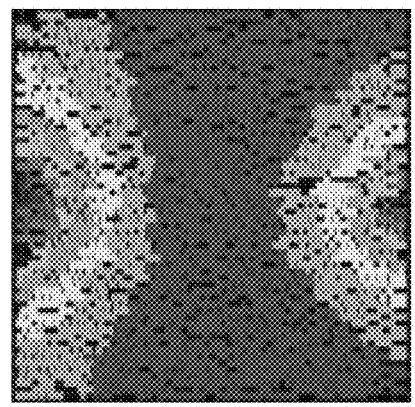

FIG. 5(a) is an IR-drop distribution map of a benchmark s15850 according to the preferred embodiment of the present invention.

Figure 5B:
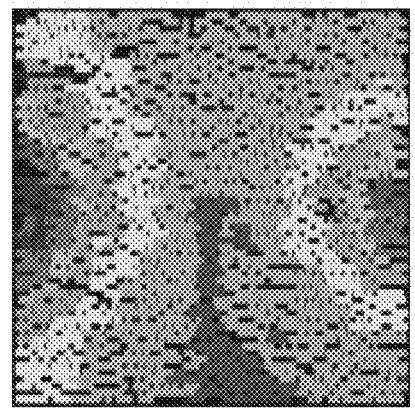

FIG. 5(b) is an IR-drop distribution map of a benchmark s13207 according to the preferred embodiment of the present invention.

Figure 5C:
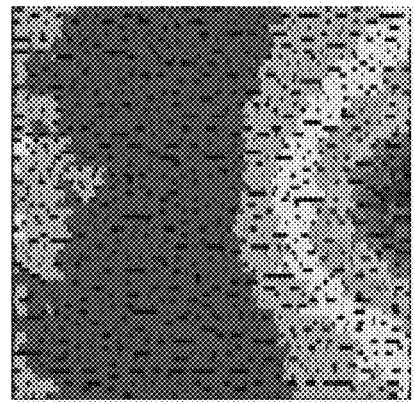

FIG. 5(c) is an IR-drop distribution map of a benchmark b14 according to the preferred embodiment of the present invention.

Figure 5D:
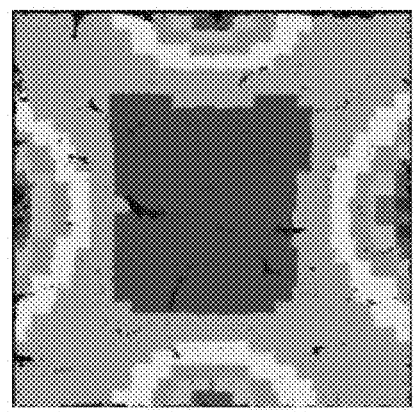

FIG. 5(d) is an IR-drop distribution map of a benchmark b19 according to the preferred embodiment of the present invention.

Figure 6:
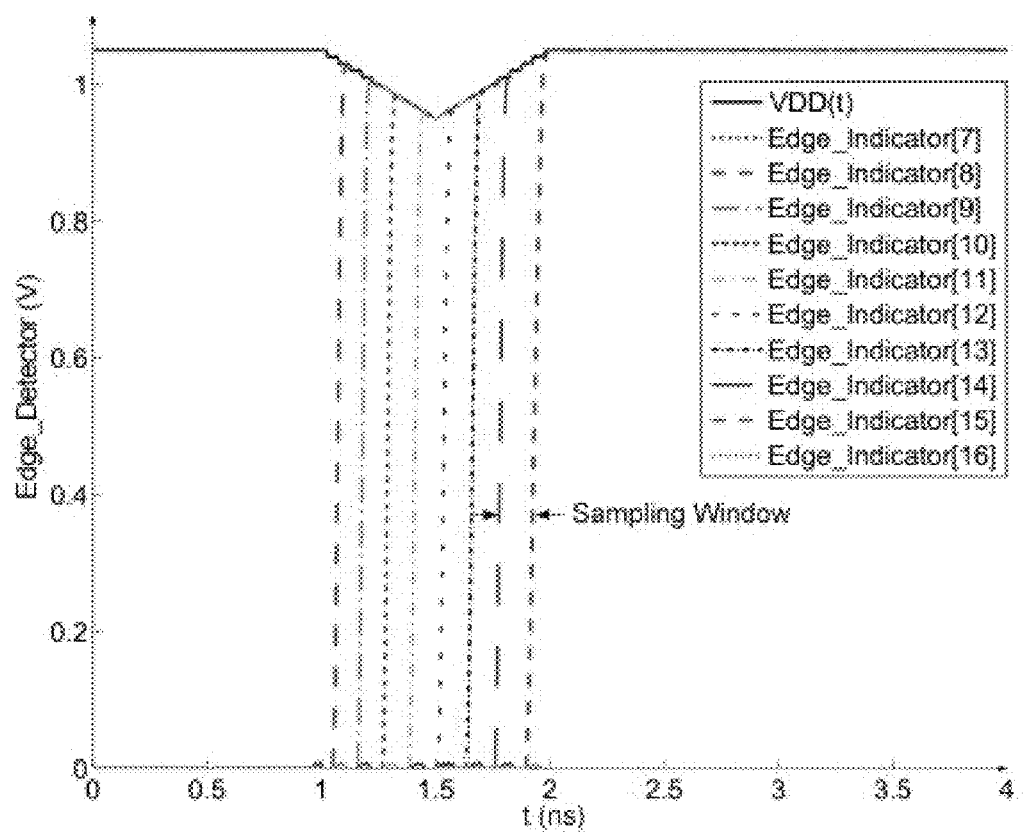

FIG. 6 is a sketch diagram of waveforms of signatures of an Edge Detector with a peak of 0.1V and a width of ins according to the preferred embodiment of the present invention.

Figure 7:
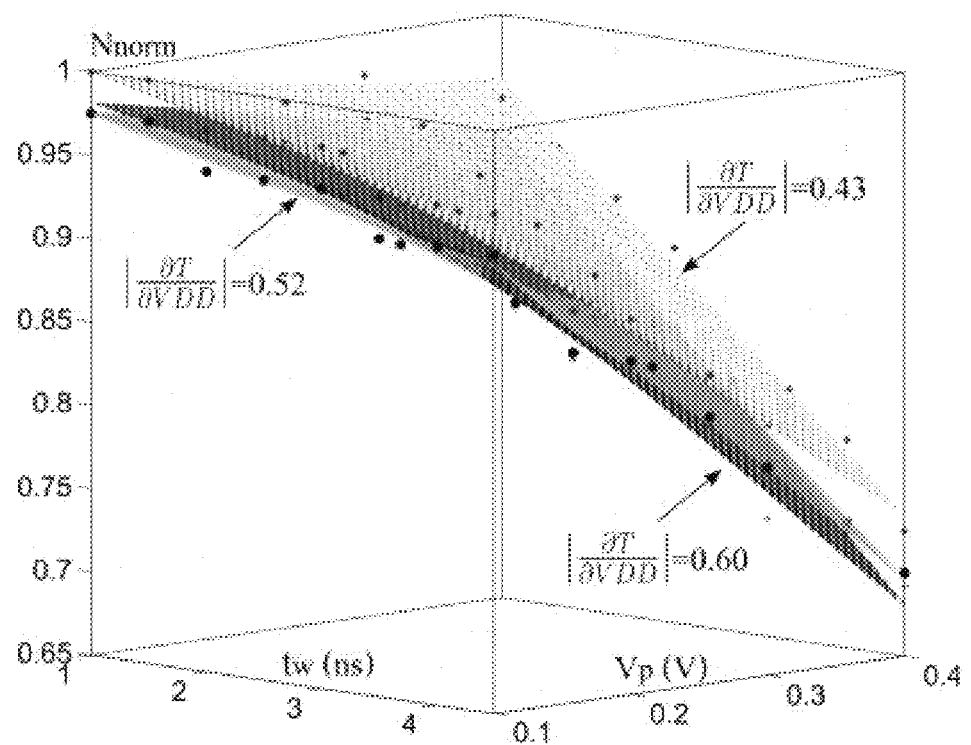

FIG. 7 is a Matlab fitted lookup plane of the IR-drop width $t_w$, the IR-drop peak $V_p$, and the normalized counter value $N_{norm}$ under an actual power supply noise according to the preferred embodiment of the present invention.

Figure 8:
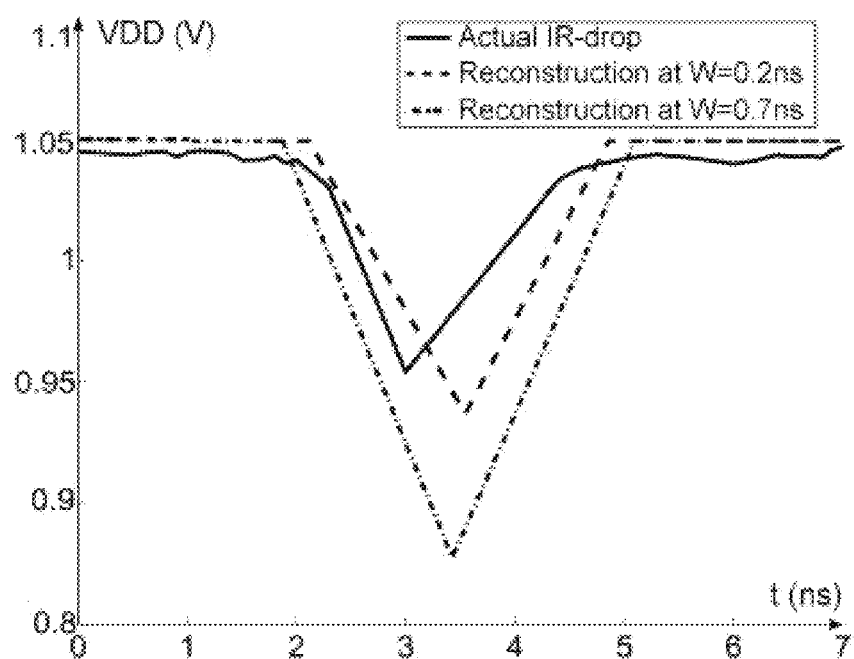

FIG. 8 is a sketch diagram of an actual IR-drop waveform and reconstructed IR-drop waveforms according to the preferred embodiment of the present invention.

Figure 9:
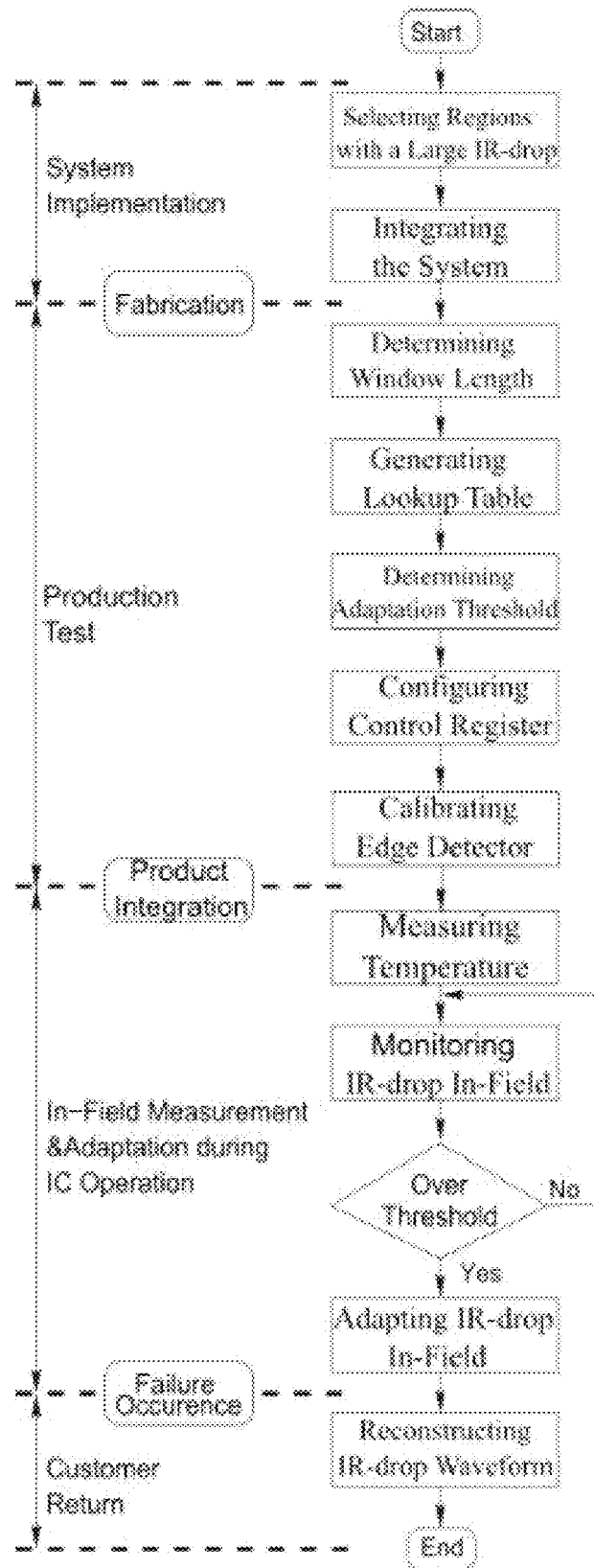

FIG. 9 is a flow diagram of a transient IR-drop waveform measurement method according to the preferred embodiment of the present invention.

In figures: A: a first region in the chip; B: a second region in the chip; C: a third region in the chip; $U_{IR\text{-}drop}^1$: a voltage signal of an IR-drop in the first region A; $U_{IR\text{-}drop}^2$: a voltage signal of an IR-drop in the second region B; $U_{IR\text{-}drop}^L$: a voltage signal of an IR-drop in an $L^{th}$ region L; $N_{i-1}$: an overall oscillation number of a Fast Ring Oscillator (RO) within first (i−1) adaptation grids; $N_i$: an overall oscillation number of the Fast RO within first i adaptation grids; $P_i$: an overall oscillation number of the Fast RO within an $i^{th}$ adaptation grid; $P_{thd}$: an adaptation threshold; $\alpha_1$, $\alpha_2$, and $\alpha_3$: three different values.

DETAILED DESCRIPTION OF THE PREFERRED EMBODIMENT

Referring to FIG. 1-FIG. 9, the present invention is further illustrated with accompanying drawings and a preferred embodiment.

Figure 2:
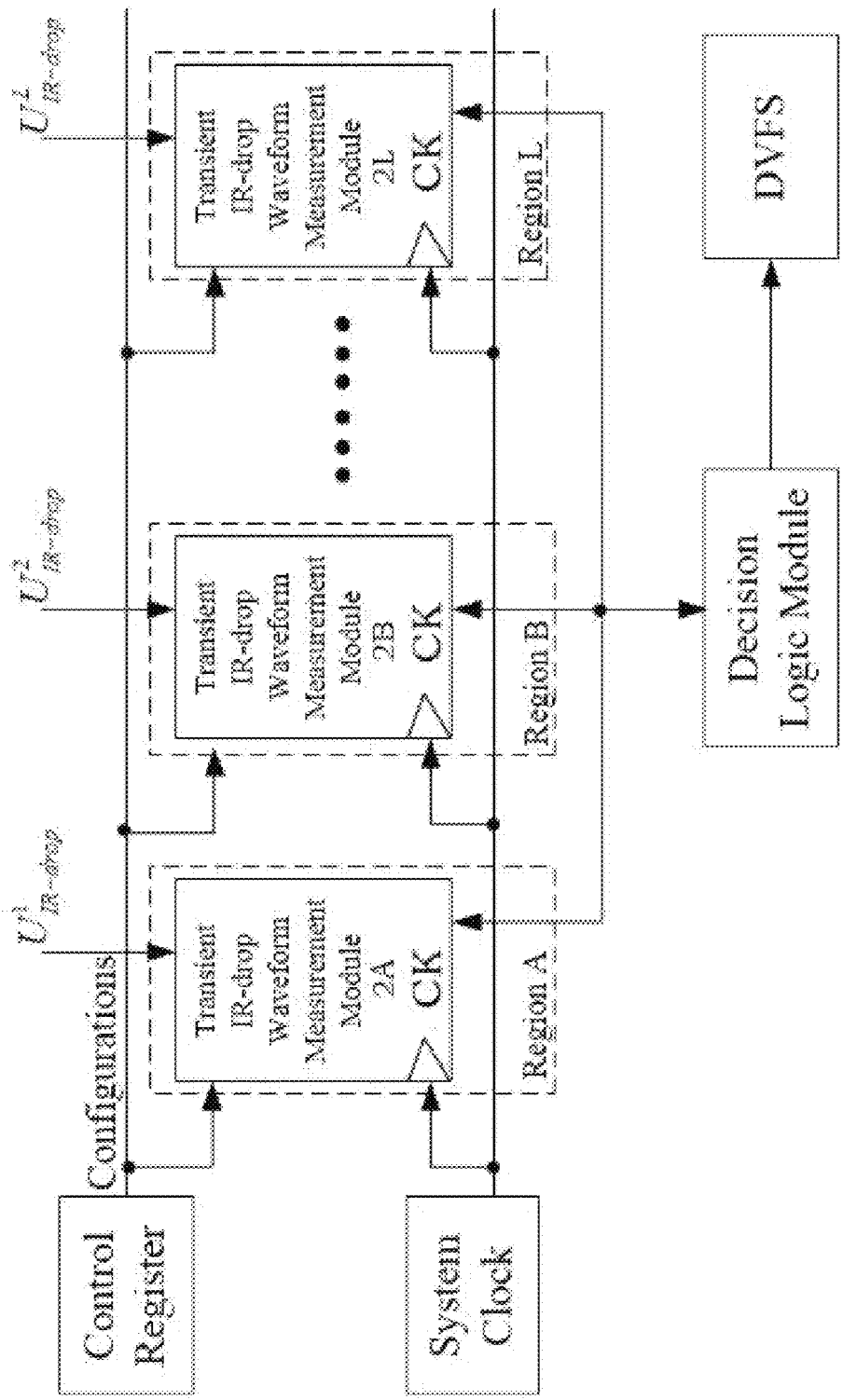
FIG. 2 is a structural block diagram of a transient IR-drop waveform measurement system according to a preferred embodiment of the present invention.

According to the preferred embodiment of the present invention, as shown in FIG. 2, a transient IR-drop waveform measurement system for a high speed integrated circuit comprises transient IR-drop waveform measurement modules (2A, 2B . . . 2L), a Control Register, and a Decision Logic Module, which are all able to be embedded in a conventional integrated circuit chip.

Electronic design automation (EDA) tools such as HSPICE and IC Compiler are used for simulations of the measurement system. The HSPICE, developed by Synopsys, is a commercial general circuit simulation program for steady state analysis, transient analysis and frequency domain analysis. Compared with Simulation Program with Integrated Circuit Emphasis (SPICE) of Berkeley, PSPICE of MicroSim and other circuit analysis softwares, more functions are added into the HSPICE, and, after continuous improvement, the HSPICE has been widely used by many companies, universities, and research and development institutions. The IC Compiler, developed by Synopsys, is a next generation place and route system. The IC Compiler is able to ensure an excellent quality and shorten a design time through a physical synthesis expansion to an entire place and route process and a design of a core drive convergence. A last generation solution has limitations due to an independent operation of place, route and clock tree. An extension of physical synthesis (XPS) technology in the IC Compiler breaks through the limitations, which expands the physical synthesis to the entire place and route process. The IC Compiler adopts a unified framework based on TCL, achieves an innovation and utilizes a most outstanding core technology in Synopsys. As a complete set of place and route design system, the IC Compiler includes all functions necessary for a next generation design, such as physical synthesis, place, route, timing, signal integrity (SI) optimization, low power consumption, design for testability (DFT) and yield optimization.

Figure 3A:
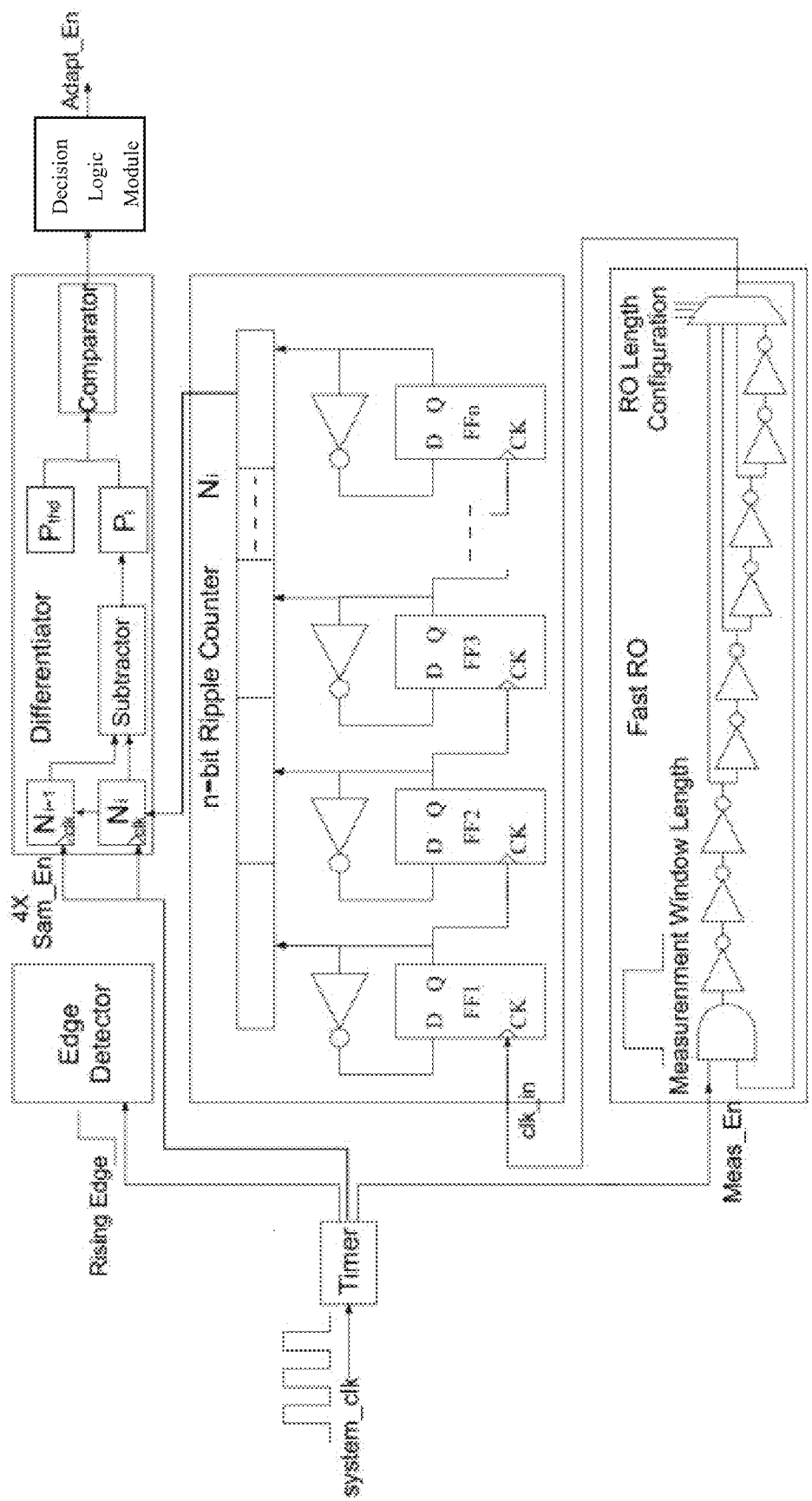
FIG. 3(a) is a structural sketch diagram of a transient IR-drop waveform measurement module of the measurement system according to the preferred embodiment of the present invention.

Referring to FIG. 3(a), each transient IR-drop waveform measurement module (2A, 2B . . . 2L) comprises a Fast Ring Oscillator (RO), an Edge Detector, a Ripple Counter, a Differentiator and a Timer. Each transient IR-drop waveform measurement module is able to measure and reconstruct a width and a peak of an IR-drop waveform in any region in several nanoseconds. Moreover, an output of the Decision Logic Module is sent to various dynamic voltage frequency scaling (DVFS) systems for adaptation, so as to reduce effects on performance of the integrated circuit chip caused by a power supply noise. The measurement system provided by the present invention has following features: 1) IR-drop peak/width measurement ability; 2) low fabrication and test cost; 3) high accuracy and sensitivity; and 4) early adaptation ability. Therefore, the measurement system can be used alone for chip monitoring or testing, in order to reduce an IR-drop to the chip.

1. An IR-Drop Waveform of a Power Supply Network on the Chip

A power supply voltage for simulation is 1.05V. When a large number of gates switch simultaneously, large periodic IR-drop noises are generated, which greatly affects a power integrity. The IR-drop causes a periodic fluctuation of the power supply voltage, and the IR-drop waveform thereof is showed in FIG. 1(b).

2. A Region Selection for the Measurement System

Figure 1A:
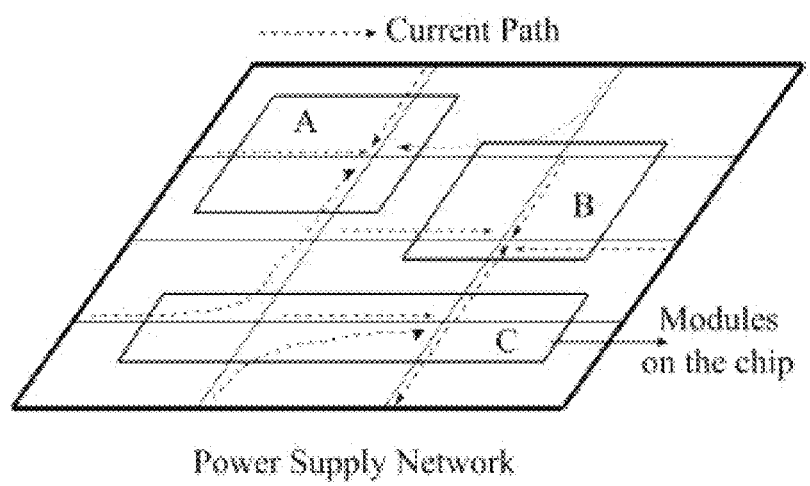
FIG. 1(a) is a schematic diagram of a power supply network and various regions in a conventional integrated circuit chip.
Figure 1B:
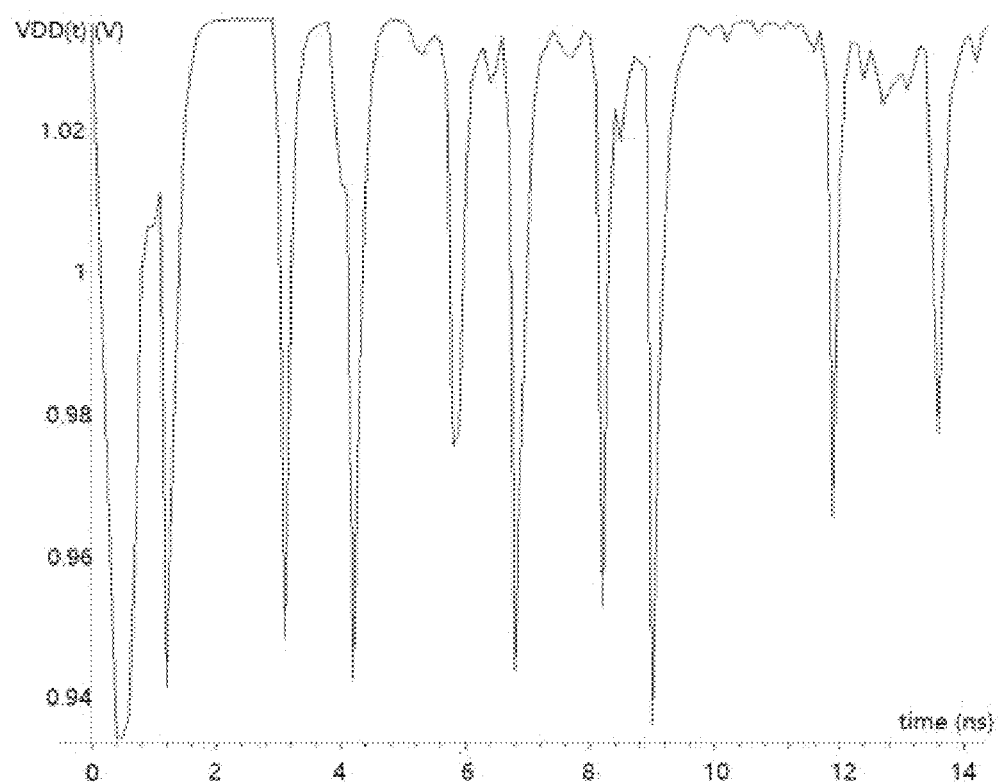
FIG. 1(b) is a schematic diagram of a power supply voltage waveform in the integrated circuit chip when an IR-drop exists.

Referring to FIG. 1(a), switching activities in L regions of the chip are intense, such as in a first region A, a second region B . . . an $L^{th}$ region L. As shown in FIG. 2, because the switching activities in the L regions are intense, L transient IR-drop waveform measurement modules are arranged in the L regions. A transient IR-drop waveform measurement module located in the first regions A is denoted as a first transient IR-drop waveform measurement module 2A; a transient IR-drop waveform measurement module located in the second region B is denoted as a second transient IR-drop waveform measurement module 2B; and a transient IR-drop waveform measurement module located in the $L^{th}$ region L is denoted as an $L^{th}$ transient IR-drop waveform measurement module 2L. A structure of each measurement module in each region is identical. The L measurement modules share the Control Register and the Decision Logic Module for a low area overhead.

Each region of the chip is powered by the power supply network. The transient IR-drop waveform measurement system provided by the present invention is connected to the power supply network in each region, so that the IR-drop in each region is accurately measured in time. A voltage signal of the IR-drop in the first region A is denoted as $U_{IR\text{-}drop}^{A}$, a voltage signal of the IR-drop in the second region B is denoted as $U_{IR\text{-}drop}^{B}$, and a voltage signal of the IR-drop in the $L^{th}$ region L is denoted as $U_{IR\text{-}drop}^{L}$. For explaining easily, the $U_{IR\text{-}drop}^{L}$ also represents a voltage signal of an IR-drop in any region.

Each transient IR-drop waveform measurement module comprises the Fast RO 20D, the Edge Detector 20E, the Ripple Counter 20A, the Differentiator 20B and the Timer 20C, as shown in FIG. 3(a).

3. The Control Register

For the Control Register, configuration values are written into the Control Register through serial or parallel data interfaces before measuring. The configuration values comprise a measurement start time, a measurement window length, a sampling window length, and an adaptation threshold.

4. The Decision Logic Module

On the one hand, the Decision Logic Module determines whether an adaptation mode is needed. During measurement, once a larger IR-drop occurs, if an oscillation number of the Fast RO 20D which is also an output of the Differentiator becomes smaller than the predefined adaptation threshold, the output of the Decision Logic Module turns to logic "1", and hence the connected DVFS systems are triggered, so as to adapt the power supply network. On the other hand, the Decision Logic Module generates calibration terminal signals for the Edge Detector 20E. During calibration of the Edge Detector 20E, the Decision Logic Module decides whether strong and weak sub-branches are calibrated to a same length. If a specific bit flips while increasing a length of the strong sub-branch, a calibration for a branch corresponding to the strong sub-branch ends.

5. The $L^{th}$ IR-Drop Waveform Measurement Module 2L

As shown in FIG. 3(a), each transient IR-drop waveform measurement module comprises the Fast RO 20D, the Edge Detector 20E, the Ripple Counter 20A, the Differentiator 20B and the Timer 20C.

An average IR-drop level is able to be measured through the Ripple Counter 20A and the Fast Ro 20D. A counter value N represents the overall oscillation number at an end of a measurement window. The Edge Detector 20E detects a width of the IR-drop waveform by splitting the measurement window into multiple sampling windows, and an m-bit Edge_Indicator[m-1:0] is arranged for each sampling window. The logic "1" of an indicator bit [i] means an IR-drop still exists in an $i_{th}$ sampling window, while logic "0" of an indicator bit [j] means an IR-drop in a $j_{th}$ sampling window has gone. The Differentiator 20A cooperates with the Decision Logic Module, for deciding whether to trigger the adaptation mode. The Timer 20C is for generating clock signals required by the Differentiator, the Fast RO, and the Edge Detector through a system clock.

The Fast RO 20D

As an oscillation frequency of the Fast RO is sensitive to a power supply voltage level, the Fast RO is used as an average IR-drop detector. The Fast RO comprises an AND gate, an odder number of inverters, and a multiplexer (mux), which are connected end to end. Since an oscillation period of the Fast RO is two times of a sum of delays of all the inverters, the oscillation frequency is determined by both the delays of the inverters and the number of the inverters.

To reduce a frequency measurement error, the oscillation frequency of the Fast RO is suggested to be as high as possible. As a result, for different level IR-drops, different lengths of the Fast RO are selected from the mux. Moreover, the Fast RO oscillates through the measurement window.

The Ripple Counter 20A

As shown in FIG. 3(a), the Ripple Counter 20A is an asynchronous counter, comprising n pairs of the flip-flops and inverters. A periodic oscillation signal of the Fast RO serves as a clock signal of a first level flip-flop in the Ripple Counter, and then an output of the first level flip-flop serves as a clock signal of a next level flip-flop. Due to an asynchronous characteristic of the Ripper Counter, the Ripper Counter is able to work with the Fast RO with a higher frequency than a conventional synchronous counter. It is noted that a maximum measurable frequency is usually limited by a metastability window length of the first level flip-flop in the Ripple Counter.

With a cooperation of the Fast RO, the Ripper Counter counts the overall oscillation number of the Fast RO at the end of the measurement window. The counter value N represents the overall oscillation number at the end of the measurement window, while $N_0$ is defined as a noise-free counter value. Moreover, the number of the flip-flops and the inverters in the Ripple Counter is determined by data operation bits of the chip. A small number of the flip-flops and the inverters are unable to meet counting requirements of the Fast RO, while a large number of the flip-flops and the inverters cause a higher area overhead on the chip. Meanwhile, the measurement window is also divided into several adaptation grids. The counter value N is transmitted to the Differentiator 20B at an end of each adaptation grid.

The Edge Detector 20E

Figure 3B:
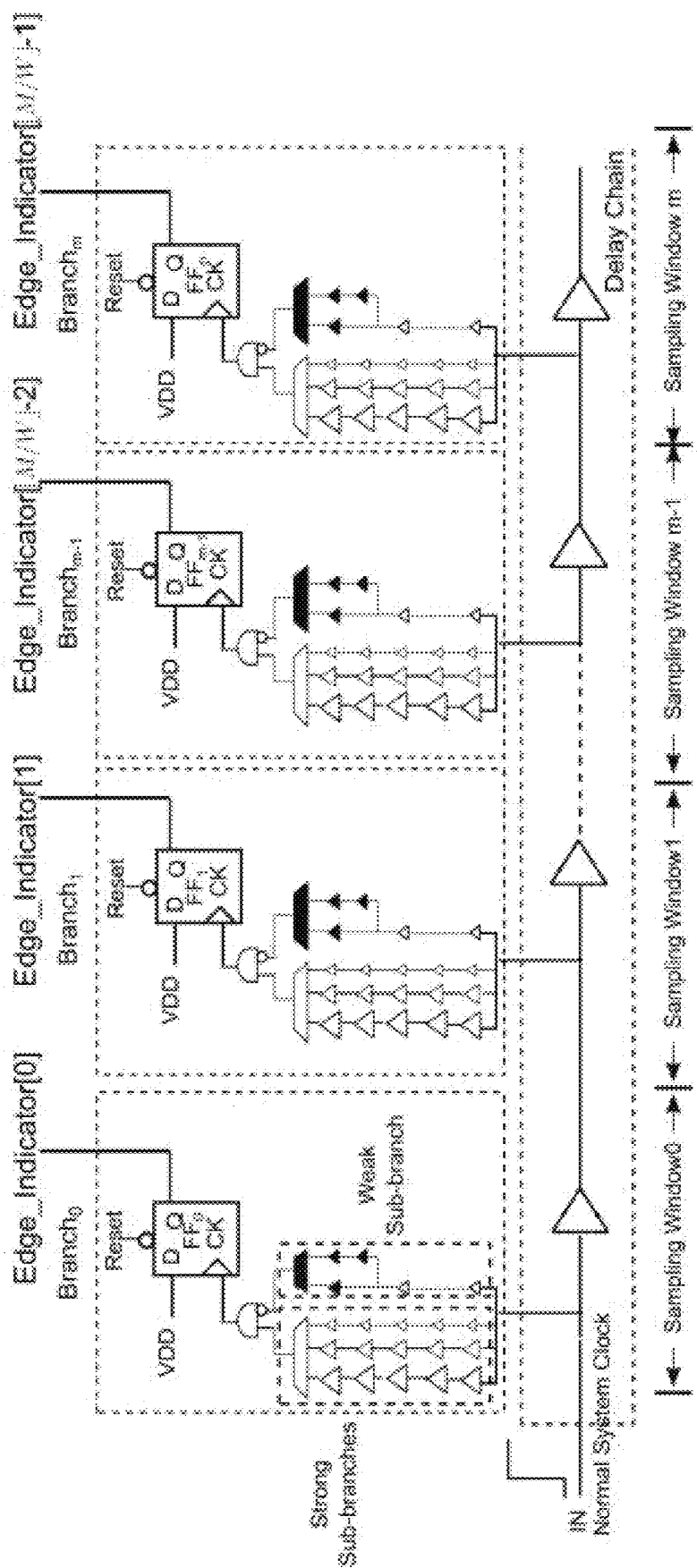
FIG. 3(b) is a structural sketch diagram of an Edge Detector in the measurement module according to the preferred embodiment of the present invention.

As shown in FIG. 3(b), the Edge Detector which has a comb branch structure is for marking voltage dropping-off and ramping-up time points and then obtaining the width of the IR-drop waveform. All branches have a same structure. Each branch comprises two sub-branches, respectively the weak sub-branch and the strong sub-branch. The weak sub-branch comprises small buffers with large loads, while the strong sub-branch comprises large buffers with small loads.

During measurement, a clock rising edge signal is transmitted along a delay buffer chain which comprises several buffers at a bottom of the Edge Detector. After a certain time interval, the clock rising edge signal reaches a next branch. The time interval is a delay of buffers between the branches and is the sampling window length $t_{sam}$. When the clock rising edge signal reaches an upper end of the branch, the clock rising edge signal is transmitted towards a signature flip-flop (i.e. FF1 of Branch1 in FIG. 3(b)). With a large dropping power supply, the weak sub-branch has a longer delay then the strong sub-branch, and thus a delay difference increases. The higher the IR-drop, the larger the delay difference. When the delay difference increases to a certain extent, a glitch occurs at an output end of the AND gate as well as a clock input of the flip-flop. Hence, the glitch is seen as a rising edge signal which turns the flip-flop into the logic "1". It is concluded that: if lengths of the strong sub-branch and the weak sub-branch are calibrated to be close to each other under a normal power supply before measurement, the output of each flip-flop is the logic "0". As a result, the signature flip-flop combined with the AND gate having an inverted input end at an end of each branch works as a fast-slow arbiter.

The outputs of all the flip-flops form the m-bit Edge_Indicator[m-1:0], such as 0 . . . 01 . . . 10 . . . 00, wherein: the logic "1" at the indicator bit [i] means the IR-drop exists in the $i_{th}$ sampling window; and the logic "0" at the indicator bit [j] means the IR-drop in the $j_{th}$ sampling window has gone. Thus, the width of the IR-drop waveform is calculated as $t_{width}=(j-i+1)\times t_{sam}$. As the delay of the buffers between the branches is easily to be below 50 ps (the delay of several fast buffers), the Edge Detector has an extremely high resolution.

The Differentiator 20B

As shown in FIG. 3(a), the Differentiator 20B, connected between the Ripple Counter 20A and the Decision Logic Module, is a second order difference module for comparing values of the oscillation number P and the adaptation threshold $P_{thd}$ within one adaptation grid. The P represents the overall oscillation number of the Fast RO under a relatively large IR-drop within one adaptation grid, and the $P_{thd}$ represents the predefined adaptation threshold written in the Control Register and the overall oscillation number of the Fast RO within one adaptation grid without the IR-drop. The Differentiator 20B comprises three registers, a comparator and a subtractor. During measurement, two consecutive counter values from the Ripple Counter 20A are input into the subtractor, and a difference between the two consecutive counter values is input into the Decision Logic Module. Once the difference is smaller than the adaptation threshold, the adaptation mode is triggered.

According to the preferred embodiment of the present invention, a length of each adaptation grid in the Differentiator 20B equals to a quarter of a system clock cycle. As a result, the Differentiator 20B is also able to trigger a quick adaptation within one clock cycle by comparing the P which is also the output of the Differentiator with the predefined adaptation threshold $P_{thd}$.

The Timer 20C

As shown in FIG. 3(a), a system clock signal of the chip is a square waveform, having a peak of 1.05V and a period of 4 ns. Based on the system clock, the Timer 20C generates the clock signals required by the Differentiator, the Fast RO, and the Edge Detector. Referring to FIG. 3(a), the Timer determines the measurement window length for the Fast RO 20D, which is equal to a period of the IR-drop waveform. Moreover, the Timer provides the rising edge signal for the Edge Detector 20E to measure the width of the IR-drop. A jumping time from "0" to "1" is consistent with the measurement widow. Finally, the adaptation grid is also input to the Differentiator 20B. Through in-field usage, the Decision Logic Module also determines whether the adaptation mode is needed according to the outputs of the Differentiator and the adaptation threshold.

According to the preferred embodiment of the present invention, for a single-clock system, the measurement signal usually lasts for one system clock cycle. For a multiple-clock system or a system comprising both positive-edge devices and negative-edge devices, the measurement window is suggested to be as short as the shortest clock cycle, or half of the system clock cycle.

Influences of a Temperature on Lookup Tables

As process and temperature variations may affect an operation of the measurement system, a fast lookup table generation process is proposed for avoiding the influence of the temperature during IR-drop waveform reconstruction for each Fast RO.

The counter value N for a specific measurement window M under an arbitrary power supply waveform VDD(t) is expressed by Equation (1):

$$N = \frac{M - \int_0^M \left|\frac{\partial T}{\partial VDD}\right| [VDD - VDD(t)]dt}{T}, \quad (1)$$

wherein the $N_0$ is defined as the noise-free counter value; and the $$\left|\frac{\partial T}{\partial VDD}\right|$$

stands for a delay-VDD sensitivity.

A normalized counter value $N_{norm}$ is calculated according to Equation (2):

$$N_{norm} = \frac{N}{N_0} = \frac{M - \int_0^M \left|\frac{\partial T}{\partial VDD}\right| [VDD - VDD(t)]dt}{M}. \quad (2)$$

According to the above equations, with the fixed measurement window M and a given VDD(t) with the width $t_w$ and the peak $V_p$ of the IR-drop waveform, the normalized counter value $N_{norm}$ (representing an IR-drop average) is determined only by the delay-VDD sensitivity $$\left|\frac{\partial T}{\partial VDD}\right|;$$

which is a function of the process and temperature variations. Therefore, if the $$\left|\frac{\partial T}{\partial VDD}\right|$$

is determined, a relationship between the IR-drop average (represented by the $N_{norm}$), and the width $t_w$ and the peak $V_p$ of the IR-drop waveform (represented by the VDD(t)) is established. According to experimental results, the $$\left|\frac{\partial T}{\partial VDD}\right|$$

is considered as a constant within a moderate IR-drop range. However, the $$\left|\frac{\partial T}{\partial VDD}\right|$$

varies with the process and the in-field temperature. Since the process variations are fixed after fabrication, hence the $$\left|\frac{\partial T}{\partial VDD}\right|$$

is only determined by the temperature, which is able to be measured by an automation test equipment (ATE).

It is difficult to directly obtain the $$\left|\frac{\partial T}{\partial VDD}\right|.$$

Thus, a four-step lookup table generation process during a design stage and a manufacturing test is proposed, and details thereof are described as follows.

According to the preferred embodiment of the present invention, a transient IR-drop waveform measurement method for the high speed integrated circuit comprises following steps, as shown in FIG. 9.

Step 1: Selecting Regions with the Large IR-Drop

The regions with the potentially high IR-drop (namely with a large number of the gates switching simultaneously) are selected and marked by applying functional or structural test patterns through the EDA tool named IC Compiler.

Step 2: Integrating the Measurement System

The Control Register and the Decision Logic Module are placed in spare areas of the chip without too much congestion, while the multiple measurement modules, respectively the 2A, the 2B . . . the 2L, are inserted into the marked regions. Each measurement module is connected to a power supply network corresponding to the respective region, and the system clock is routed to an input end of the Timer 20C automatically by the EDA tools.

Step 3: Determining the Measurement Window Length and the Sampling Window Length The measurement window length is determined according to the system clock. For the single-clock system with only the positive-edge devices, the measurement window can be as long as one system clock cycle. For a region comprising both the positive-edge devices and the negative-edge devices, double IR-drop peaks occur in each clock cycle, thus the measurement window should equal to half of the system clock cycle. For a multiple-clock region, the measurement window is suggested to be the same as the shortest clock cycle. Meanwhile, an optimal sampling window length is determined according to the number of the buffers in the Edge Detector 20E.

Step 4: Generating Lookup Tables

Besides the overall counter value within the measurement window and signatures of the Edge Detector 20E obtained directly from the measurement module, the IR-drop peak is required to obtain the IR-drop waveform, and thus a fast three-dimensional lookup table is generated for showing a relationship among the IR-drop peak, the IR-drop width and the normalized counter value. Moreover, as the process and temperature variations may affect the operation of the measurement system, several lookup tables are required to be generated for showing the relationship among the IR-drop peak, the IR-drop width and the normalized counter value under different temperatures.

The step 4 of generating the lookup tables further comprises steps of:

1) generating an $N_0$-K lookup table (shown in FIG. 4a) suitable for each manufactured Fast RO, wherein the $N_0$-K lookup table correlates the noise-free counter value $N_0$ and a temperature K ranging from −40° C.-120° C.; and depicting the $N_0$-K lookup table by the ATE during a production test;

2) generating a K-

$$\left|\frac{\partial T}{\partial VDD}\right|$$

lookup table (shown in FIG. 4b) suitable for a specific Fast RO during the production test through stepping the VDD and measuring a variation of the Fast RO oscillation period under the various temperatures K which ranges from −40° C.-120° C., wherein the K-

$$\left|\frac{\partial T}{\partial VDD}\right|$$

lookup table correlates the temperature K and the $$\left|\frac{\partial T}{\partial VDD}\right|;$$

3) repeating above two steps for each on-chip Fast RO during the production test, and storing obtained lookup tables either on-chip or off-chip;

4) obtaining a three-dimensional $V_p$-$t_w$-$N_{norm}$ lookup table (shown in FIG. 4c) through simulating by the SPICE, wherein: the three-dimensional $V_p$-$t_w$-$N_{norm}$ lookup table correlates the width $t_w$ of the IR-drop waveform, the peak $V_p$ of the IR-drop waveform, and the normalized counter value $N_{norm}$ at the various $$\left|\frac{\partial T}{\partial VDD}\right|;$$

and the various $$\left|\frac{\partial T}{\partial VDD}\right|$$

are easily obtained by changing a load or a cell type of an arbitrary Fast RO.

Step 5: Determining the Adaptation Threshold

To minimize an adaptation reaction time, the adaptation threshold is determined according to the output of the Differentiator 20B, which is obtained within one adaptation grid. During an ATE test, an intensity of the structural or functional patterns is increased until a first failure occurs, and the corresponding output is assigned as the adaptation threshold.

Step 6: Configuring the Control Register

Before measurement, the Control Register is configured. A configuration process comprises steps of: writing a start clock cycle, the measurement window length, a branch configuration of the Edge Detector 20E, the adaptation threshold, and the length of the Fast RO 20D into the Control Register.

Step 7: Calibrating the Edge Detector

Inside each branch of the Edge Detector branch, the lengths of two sub-branches are calibrated to be close to each other. By increasing the length of the strong sub-branch, the Decision Logic Module checks the Edge_Indicator[m-1:0] all the time. If no too much IR-drop exists, every bit of the signature is required to be the logic "0". Once a specific bit flips during checking, a calibration for the corresponding branch ends.

Step 8: Measuring the Temperature

In the step 7, a three-step lookup table checking process is proposed. Since the different delay-VDD sensitivities correspond to different three-dimensional planes, a proper plane for obtaining the noise peak is determined before in-field detecting. To obtain a local temperature, the Fast RO oscillates for a time length of the measurement window M with little circuit activities, and the counter value is recorded. Finally, according to the already generated lookup tables, an in-filed temperature is obtained.

Step 9: Monitoring in-Field

During in-field monitoring, the system starts at a pre-defined time, and works for a time that equals to the measurement window length. The obtained counter values within the measurement window and each adaptation grid, and an m-bit signature value Edge_Indicator[m-1:0] of the Edge Detector 20E are stored in an on-chip Flash.

Step 10: Adapting in-Field

The Decision Logic Module compares the output of the Differentiator with the predefined adaptation threshold. When the IR-drop noise is over the adaptation threshold, the output of the Decision Logic Module switches to the logic "1" to adapt the DVFS system and compensates the power supply network.

Step 11: Reconstructing the IR-Drop Waveform

After in-field measurement, such as during a customer return, the recorded $N_0$, counter value N and values of the Edge_Indicator[m-1:0] are read out. Then, the width and the peak of the IR-drop are calculated according to the read out values and the lookup tables. Finally, a triangular IR-drop is reconstructed.

The transient IR-drop waveform measurement system provided by the present invention is tested with 28 nm Nangate technology through the HSPICE. The Fast RO comprises the multiplexers, the inverters, and at least three inverters. The Ripple Counter is an 8-bit counter. The simulation is performed under the temperature ranging from −40° C.-120° C. and the standard power supply of 1.05V. Moreover, the measurement window M is 7 ns. During simulation, variations of 1% $t_{ox}$, 5% W, 10% L, and 25% $V_{th}$ are applied on the chip, wherein: the $t_{ox}$ is a gate oxide thickness, the L is a gate length, the W is a gate width and the $V_{th}$ is a threshold voltage. When the power supply voltage is 1.05V without any noise, because the above variations exist, the period of the Fast RO is around 56-66 ps The measurement system are inserted into ITC benchmarks, respectively s15850, s13207, b14, b19, and a 64-bit Floating Point and Graphics Unit (FGU) set from a Open-SPARCT2 SPARC core.

For a sensor location selection, IR-maps of the four ITC benchmarks of s15850, s13207, b14, and b19 under the various functional patterns are firstly obtained through the IC Compiler, as shown in FIG. 5(a)-FIG. 5(d). A red region in the IR-maps means that a potentially large IR-drop exists during operation, and the measurement modules are inserted into the selected red regions. Because a congestion level of the regions with the higher IR-drop is high, the Control Register and the Decision Logic Module are placed in the spare areas with a lower congestion. Table 1 shows the number of system frontends as well as a total area overhead of each benchmark.

TABLE 1

| Benchmark | Number of system frontends and total area overhead of each benchmark | | | | |
|---|---|---|---|---|---|
| | s15850 | s13207 | b14 | b19 | FGU Set |
| Number of System Frontends | 1 | 1 | 2 | 9 | 18 |
| Area Overhead | 10.02% | 9.19% | 15.2% | 2.14% | 2.23% |

Then, the sampling window length is decided. As illustrated before, the sampling window length is determined by the delay of the buffers between the branches of the Edge Detector. An appropriate sampling window length needs fewer numbers of the buffers without losing voltage falling and rising details, and thus the area overhead is low. For the IR-drop with a peak of 0.1V and a width of 2.5 ns, six sampling window lengths, respectively 0.7 ns, 0.6 ns, 0.5 ns, 0.4 ns, 0.3 ns, and 0.125 ns, are chosen for analysis. Meanwhile, an $i_{th}$ bit of the Edge_Indicator[m-1:0], which switches first when the IR-drop comes, and an $j_{th}$ bit of the Edge_Indicator[m-1:0], which switches last before the IR-drop disappears, are recorded, in such a manner that the width of the IR-drop waveform is calculated. Width measurement results are showed in Table 2.

TABLE 2

Width measurement results for IR-drop
with peak of 0.1 V and width of 2.5 ns

| Actual Width $t_w$ (ns) | Sampling Window Length $t_{sam}$ (ns) | Bit number i of first switching bit of Edge Detector | Bit number j of last switching bit of Edge Detector | Measured Width $t'_w$ (ns) | Error rate |
|---|---|---|---|---|---|
| 2.5 | 0.7 | 2 | 6 | 2.925 | 17.0% |
|  | 0.6 | 2 | 5 | 3.125 | 25.0% |
|  | 0.5 | 2 | 6 | 2.125 | 15.0% |
|  | 0.4 | 2 | 7 | 2.125 | 15.0% |
|  | 0.3 | 2 | 9 | 2.225 | 11.0% |
|  | 0.125 | 2 | 19 | 2.275 | 5% |

From Table 2, it is seen that, when the sampling window length is reduced to 0.125 ns, the signatures of the Edge_Indicator[m-1:0] becomes 01111111111111111110, the measured width is 2.275 ns, and the error rate is 5%. Table 2 shows accurate width measurement results for the IR-drop waveform. As a result, the type and the number of the related buffers which satisfy the sampling window length of 0.125 ns are selected for a further measurement.

For the IR-drop with the peak of 0.1V and the width of 2.5 ns the sampling window length of 0.125 ns is chosen for the measurement. Signatures of the Edge_Indicator[m-1:0] becomes 00000001111111100000, i=8, j=15, the measured width is 1 ns, and the error rate is 0%. Waveforms of the signatures of the Edge_Indicator[m-1:0] of the Edge Detector are showed in FIG. 6.

Then, the three-dimensional lookup table is generated. The $N_0$-K lookup and the K-

$$\left|\frac{\partial T}{\partial VDD}\right|$$

lookup table are generated during the ATE test. The Fast RO oscillates under the various temperatures from −40° C.-120° C. with a step of 10° C. and little circuit activity. Then, the three-dimensional $V_p$-$t_w$-$N_{norm}$ lookup table is generated at the various $$\left|\frac{\partial T}{\partial VDD}\right|$$

by an HSPICE simulation in a design stage without considering the process and temperature variations. The $V_p$-$t_w$-$N_{norm}$ lookup table for the Fast RO at a temperature of 25° C. is showed in Table 3, and the $$\left|\frac{\partial T}{\partial VDD}\right|$$

equals to 0.52 ps/mV.

TABLE 3

$V_p$ - $t_w$ - $N_{norm}$ lookup table at 25° C.

| Width $t_w$ (ns) | Peak $V_p$ (V) | Normalized Counter Value $N_{norm}$ |
|---|---|---|
| 1 | 0.1 | 0.989 |
| 1 | 0.2 | 0.979 |
| 1 | 0.3 | 0.979 |
| 1 | 0.4 | 0.968 |
| 1.5 | 0.1 | 0.989 |
| 1.5 | 0.2 | 0.979 |
| 1.5 | 0.3 | 0.968 |
| 1.5 | 0.4 | 0.957 |
| 2 | 0.1 | 0.979 |
| 2 | 0.2 | 0.968 |
| 2 | 0.3 | 0.947 |
| 2 | 0.4 | 0.936 |
| 2.5 | 0.1 | 0.979 |
| 2.5 | 0.2 | 0.957 |
| 2.5 | 0.3 | 0.936 |
| 2.5 | 0.4 | 0.915 |
| 3 | 0.1 | 0.968 |
| 3 | 0.2 | 0.957 |
| 3 | 0.3 | 0.926 |
| 3 | 0.4 | 0.904 |
| 3.5 | 0.1 | 0.979 |
| 3.5 | 0.2 | 0.947 |
| 3.5 | 0.3 | 0.926 |
| 3.5 | 0.4 | 0.894 |
| 4 | 0.1 | 0.968 |
| 4 | 0.2 | 0.947 |
| 4 | 0.3 | 0.915 |
| 4 | 0.4 | 0.883 |
| 4.5 | 0.1 | 0.968 |
| 4.5 | 0.2 | 0.936 |
| 4.5 | 0.3 | 0.894 |
| 4.5 | 0.4 | 0.862 |

To speed up the lookup table checking process and save memory, a fitted three-dimensional $V_p$-$t_w$-$N_{norm}$ lookup plane (shown in FIG. 7) is expressed as a fitting formula:

$$N_{norm} = a + b\sin(m\pi t_w V_p) + ce^{-\frac{wV_p}{2}}. \quad (3)$$

By curve fitting through Matlab with multiple simulated $N_{norm}$, $t_w$, and $V_p$ by the SPICE, values of a, b and c are determined, respectively 1.03, −0.272 and −0.0364.

Sums of a square error and R-square are 0.0016 and 0.9802, which shows the fitting formula is able to accurately describe the $V_p$-$t_w$-$N_{norm}$ relationship.

The measured width $t_w'$ and peak $V_p'$ the IR-drop waveform are obtained, and the error rate is allowable, as shown in Table 4. If the IR-drop waveform is modeled as a triangle, an obtained reconstructed IR-drop waveform is showed in FIG. 8.

TABLE 4

IR-drop reconstruction errors

| Sampling Window Length $t_{sam}$ (ns) | Actual Width/Peak $t_w$ (ns)/ $V_p$ (V) | Measured Width/Peak $t'_w$ (ns)/ $V'_p$ (V) | Width Error % | Peak Error % |
|---|---|---|---|---|
| 0.125 | 1.1/0.1 | 1.025/0.091 | 6.82% | 9.00% |
|  | 2.6/0.1 | 2.625/0.105 | 0.96% | 5.00% |

By employing the Differentiator with the adaptation grid equal to a quarter of the system clock cycle, the system is able to generate Adapt_En within a time of 25% of the system clock cycle. At a second adaptation grid, the output of the Differentiator is less than the predefined threshold $P_{thd}$, and the adaptation mode is initiated.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A transient IR-drop waveform measurement method for a high speed integrated circuit, comprising steps of:
    (1) selecting regions with a large IR-drop, wherein the regions with the large IR-drop represent regions with a plurality of gates switching simultaneously, and are selected and marked by applying functional or structural test patterns through an electronic design automation (EDA) tool named IC Compiler;
    (2) integrating a measurement system, wherein: a Control Register and a Decision Logic Module are placed in spare areas of an integrated circuit chip, while transient IR-drop waveform measurement modules, respectively 2A, 2B ... 2L, are inserted into the marked regions; each transient IR-drop waveform measurement module is connected to a power supply network corresponding to the respective region, and a system clock is routed to an input end of a Timer (20C) automatically by the EDA tool;
    (3) determining a measurement window length and a sampling window length, wherein: for a single-clock system with only positive-edge devices, a measurement window is as long as one system clock cycle; for a region comprising both the positive-edge devices and negative-edge devices, double IR-drop peaks occur in each clock cycle, thus the measurement window is equal to half of the system clock cycle; for a multiple-clock region, the measurement window is the same as the shortest clock cycle; and meanwhile, an optimal sampling window length is determined according to an amount of buffers in an Edge Detector (20E);
    (4) generating lookup tables, wherein: besides an overall counter value within the measurement window and signatures of the Edge Detector (20E) obtained directly from each transient IR-drop waveform measurement module, the IR-drop peak is required to obtain an IR-drop waveform, and thus a fast three-dimensional lookup table is generated for showing a relationship among the IR-drop peak, an IR-drop width and a normalized counter value; moreover, as process and temperature variations may affect an operation of the measurement system, several lookup tables are generated for showing the relationship among the IR-drop peak, the IR-drop width and the normalized counter value under different temperatures; the step (4) of generating the lookup tables further comprising steps of:
    4a) generating an $N_0$-K lookup table suitable for a manufactured Fast Ring Oscillator (RO), wherein the $N_0$-K lookup table correlates a noise-free counter value $N_0$ and a temperature K ranging from −40° C.-120° C.; and depicting the $N_0$-K lookup table by an automatic test equipment (ATE) during a production test;
    4b) generating a K-

$$\left|\frac{\partial T}{\partial VDD}\right|$$

lookup table suitable for a specific Fast RO during the production test through stepping VDD and measuring a variation of a Fast RO (20D) oscillation period under the various temperatures K ranging from −40° C.-120° C., wherein the K-

$$\left|\frac{\partial T}{\partial VDD}\right|$$

lookup table correlates the temperature K and the $$\left|\frac{\partial T}{\partial VDD}\right|;$$

and the $$\left|\frac{\partial T}{\partial VDD}\right|$$

represents a delay-VDD sensitivity;
    4c) repeating above two steps during the production test, and storing obtained lookup tables either on-chip or off-chip; and
    4d) obtaining a three-dimensional $V_p$-$t_w$-$N_{norm}$ lookup table through simulating by Simulation Program with Integrated Circuit Emphasis (SPICE), wherein: the three-dimensional $V_p$-$t_w$-$N_{norm}$ lookup table correlates a width $t_w$ of the IR-drop waveform, a peak $V_p$ of the IR-drop waveform, and the normalized counter value $N_{norm}$ at the various $$\left|\frac{\partial T}{\partial VDD}\right|;$$

and the various $$\left|\frac{\partial T}{\partial VDD}\right|$$

are easily obtained by changing a load or a cell type of an arbitrary Fast RO;
    (5) determining an adaptation threshold, wherein: to minimize an adaptation reaction time, the adaptation threshold is determined according to an output of a Differentiator (20B), which is obtained within one adaptation grid; during an ATE test, an intensity of the structural or functional patterns is increased until a first failure occurs, and the corresponding output is assigned as the adaptation threshold;
    (6) configuring the Control Register, wherein: before measurement, the Control Register is configured; the step (6) of configuring the Control Register further comprising steps of: writing a start clock cycle, the measurement window length, a branch configuration of the Edge Detector (20E), the adaptation threshold, and a length of the Fast RO (20D) into the Control Register;

(7) calibrating the Edge Detector (20E), wherein: inside each branch of the Edge Detector (20E), lengths of two sub-branches are calibrated to be close to each other; the two sub-branches are respectively a strong sub-branch and a weak sub-branch; the weak sub-branch has a longer delay then the strong sub-branch; by increasing a length of the strong sub-branch, the Decision Logic Module checks an m-bit signature value Edge_Indicator[m-1:0] all the time; if no IR-drop exists, every bit of the signature is logic "0"; and, once a specific bit flips during checking, a calibration for the corresponding branch ends;

(8) measuring the temperature, wherein: in the step (7), a three-step lookup table checking process is provided; since different delay-VDD sensitivities correspond to different three-dimensional planes, a proper plane for obtaining a noise peak is determined before in-field detecting; to obtain a local temperature, the Fast RO oscillates for a time length of the measurement window, and the counter value is recorded; and finally, according to the already generated lookup tables, an in-field temperature is obtained;

(9) monitoring in-field, wherein: during in-field monitoring, the system starts at a predefined time, and works for a time that equals the measurement window length; and, the obtained counter values within the measurement window and each adaptation grid, and the m-bit signature value Edge_Indicator[m-1:0] of the Edge Detector (20E) are stored in an on-chip flash;

(10) adapting in-field, wherein: the Decision Logic Module compares the output of the Differentiator with the predefined adaptation threshold; if an IR-drop is over the threshold, an output of the Decision Logic Module switches to logic "1" to adapt a dynamic voltage frequency scaling (DVFS) system and compensates the power supply network; and

(11) reconstructing the IR-drop waveform, wherein: after in-field measurement, the recorded $N_0$, the counter value N and values of the m-bit signature value Edge_Indicator[m-1:0] are read out; then, the width and the peak of the IR-drop are calculated according to the above read out values and the lookup tables; and finally, a triangular IR-drop is reconstructed.

* * * * *